(12) United States Patent
Ito et al.

(10) Patent No.: US 6,306,770 B1
(45) Date of Patent: *Oct. 23, 2001

(54) METHOD AND APPARATUS FOR PLASMA ETCHING

(75) Inventors: Natsuko Ito; Fumihiko Uesugi; Tsuyoshi Moriya, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/273,293

(22) Filed: Mar. 19, 1999

(30) Foreign Application Priority Data

Mar. 20, 1998 (JP) .................................................. 10-072424

(51) Int. Cl.⁷ .............................. H01L 21/302; C23F 1/02
(52) U.S. Cl. ............................ 438/706; 438/710; 156/345
(58) Field of Search ..................................... 438/706, 710; 156/345

(56) References Cited

U.S. PATENT DOCUMENTS

| 5,259,923 | * | 11/1993 | Hori et al. ............................... 216/66 |
| 5,460,684 | * | 10/1995 | Saeki et al. ............................ 156/345 |
| 5,711,815 |   | 1/1998  | Lee et al. ................................ 118/725 |

FOREIGN PATENT DOCUMENTS

| 59-119839 | 7/1984 | (JP) . |
| 60-195937 | 10/1985 | (JP) . |
| 3-48421 | 3/1991 | (JP) . |
| 4-250621 | 9/1992 | (JP) . |
| 5-29272 | 2/1993 | (JP) . |
| 5-267234 | 10/1993 | (JP) . |
| 6-37074 | 2/1994 | (JP) . |
| 6-120145 | 4/1994 | (JP) . |
| 6-122978 | 5/1994 | (JP) . |
| 7-58016 | 3/1995 | (JP) . |
| 7-58033 | 3/1995 | (JP) . |
| 8-115903 | 5/1996 | (JP) . |
| 8-181112 | 7/1996 | (JP) . |
| 9-64021 | 3/1997 | (JP) . |
| 9-232290A | * | 9/1997 | (JP) ........................... H01L/21/3065 |
| 9-283459 | 10/1997 | (JP) . |

OTHER PUBLICATIONS

Nishisaka, Semiconductor Manufacturing Apoparatus, Englsih Abstract of JP 9–233390A, Sep. 1997.*

* cited by examiner

Primary Examiner—Benjamin L. Utech
Assistant Examiner—Lynette T. Umez-Eronini
(74) Attorney, Agent, or Firm—Hutchins, Wheeler & Dittmar

(57) ABSTRACT

A plasma etching apparatus includes a processing chamber for etch-processing a substrate, a lower electrode located within the processing chamber for holding the substrate on an upper surface thereof by an electrostatic attraction, and an upper electrode located to face the lower electrode. A purge gas introducing port is provided at a side wall of the processing chamber at a position which is between the upper electrode and the lower electrode in height and which opposes to the evacuation port in a plan view in such a manner that the lower electrode is positioned between the evacuation port and the purge gas introducing port in the plan view. A plasma etching method includes the steps of holding the substrate on the lower electrode in such a condition that a surface to be etched of the substrate is faced upwards, then introducing a process gas into the processing chamber, applying a high frequency voltage between the lower electrode and the upper electrode to generate a plasma gas in a low pressure so as to etch the substrate, and thereafter, introducing a purge gas into the process chamber at the time of completion of the processing. At the time of completing the processing, the supplying of the process gas is stopped and it starts to supply the purge gas into the processing chamber, and thereafter, when a predetermined time has elapsed, the application of the high frequency voltage is stopped.

12 Claims, 5 Drawing Sheets

METHOD AND APPARATUS FOR PLASMA ETCHING

BACKGROUND OF THE INVENTION

1. Field of the invention

The present invention relates to a plasma etching method and a plasma etching apparatus, and more specifically to a plasma etching method and a plasma etching apparatus, for preventing particles generated in an etching, from depositing on a substrate.

2. Description of related art

In manufacturing a semiconductor device, it is in many cases that a plasma etching apparatus is used for the purpose of executing a dry etching by use of a reactive plasma gas under a low pressure. In the following, an example of a prior art plasma etching apparatus will be described with reference to the drawings. FIG. 6 is a diagrammatic sectional view for illustrating a plasma etching apparatus generally used in a semiconductor device manufacturing factory. The plasma etching apparatus generally indicated with Reference Numeral 10 includes a processing chamber 12 for processing a substrate by an etching, a lower electrode 16 located within the processing chamber 12 for holding a substrate 11 put on an upper surface thereof, and an upper electrode 18 located to face the lower electrode 16 and having a discharge surface for generating an electric discharge between the upper electrode 16 and the substrate held on the lower electrode 16.

The lower electrode 16 includes an electrostatically attracting electrode 15 for holding the substrate 11 by action of an electrostatic attraction, an insulating plate 24 provided under the electrode 15, and a lower electrode body 17 provided under the insulating plate 24. The electrostatically attracting electrode 15 is connected to a DC voltage supply 26, and the lower electrode body 17 is connected to a high frequency voltage supply 28. The upper electrode 18 has a gas introducing path 22 for introducing a process gas and a purge gas, and gas nozzles 22 provided in a lower surface of the upper electrode 16 and over a region positioned just above the substrate. This upper electrode 18 is connected to ground.

Ordinarily, one evacuation port 23 is provided in a bottom of the processing chamber 12, and a feeding port 30 is provided a side wall of the processing chamber 12 for feeding the substrate 11.

FIG. 7 is a graph for illustrating an operating condition of the plasma etching apparatus 10 at the time of etching the substrate in the plasma etching apparatus 10, corresponding to one cycle of the substrate processing. In the plasma etching apparatus 10, a highly reactive process gas such as chlorine is introduced through the gas nozzles 22 of the upper electrode 18 into the processing chamber, and when a pressure has reached a predetermined constant pressure, a high frequency voltage is applied between the upper and lower electrodes to bring the process gas into a plasma condition, with the result that an etching is carried out. If the etching is completed, the application of the high frequency voltage and the supplying of the process gas are simultaneously stopped, and after a few seconds, a less reactive halogen gas is introduced as a purge gas.

However, in an LSI manufacturing process, in particular, in a process for etching a metal film by a plasma gas, generated particles have become a large cause for lowering the yield of production and the operating efficiency of the apparatus. A main cause of generation of the particles is that reaction products deposited on an inside of the plasma etching apparatus peel off and drop on the substrate. Accordingly, it is difficult to completely prevent the generated particles from depositing on the substrate. Under this circumstance, a method for causing the generated particles not to deposit on the substrate, or an apparatus having a function of causing the generated particles not to deposit on the substrate, have been developed. These method and apparatus are disclosed in Japanese Patent Application Pre-examination Publication Nos. JP-A-59-119839, JP-A-60-195937, JP-A-04-250621, JP-A-05-029272, JP-A-05-267234, JP-A-07-058033, JP-A-08-115903 and JP-A-06-122978 (an English abstract of these Japanese patent publications is available and the content of the English abstract of is incorporated by reference in its entirety into this application).

JP-A-59-119839 and JP-A-60-195937 propose to hold the substrate to be processed, downward or vertically, so that the particles falling by gravity is prevented from depositing on the substrate. JP-A-04-250621 propose to provide a cover on an electrode moving part and a periphery of a metal sealing, in order to prevent the falling particles from spreading in the inside of the vacuum chamber. JP-A-05-029272 proposes to mount a cover for covering the substrate just after the completion of the processing, so as to prevent the particles from falling on the substrate. These Japanese patent publications prevent the particles from falling on the substrate.

On the other hand, JP-A-05-267234 and JP-A-08-115903 propose a means for positively moving the particles thereby to prevent the particles from depositing on the substrate. JP-A-05-267234 electrostatically removes the particles by means of a dust collecting electrode. JP-A-08-115903 provides a means for preventing the flow of process gas from being directed from the working electrode to the substrate, thereby to prevent the particles included in the gas from reaching the substrate.

As combination of the above mentioned methods, JP-A-07-058033 proposes to provide an electric precipitator and a cover for covering the substrate just after the completion of the processing, so as to prevent the particles from reaching the substrate.

JP-A-06-122978 proposes to introduce the purge gas between the substrate and the high frequency electrode after the application of the high frequency voltage is stopped, and to cause the particles to reach the surface of the substrate with a few seconds, whereby the particles are prevented from depositing on the substrate surface after the film deposition.

However, the prior art methods and apparatuses disclosed in the above referred Japanese patent publications need to modify the machine or to add parts, so that the mechanism of the machine becomes complicated. In addition, the machine cost becomes high. This problem will be discussed in the following.

In order to change the substrate holding direction, it is necessary to mount heavy parts such as a feeding mechanism, a working electrode and a wafer holding mechanism, on an upper portion of the apparatus, or to hold these parts vertically. As a result, a new problem occurs in connection with a stable operation of the apparatus Furthermore, since it is necessary to strongly make a frame for supporting these heavy parts, the apparatus becomes large in size. Moreover, the substrate feeding mechanism becomes complicated. In addition, after completion of the process, in order to cover the substrate with a cover or in order to electrostatically attract the particle, it is necessary to provide a moving mechanism near to the substrate within the apparatus. Because of this, there is possibility that the particles are generated by the moving mechanism. Furthermore, provision of these mechanisms results in a further enlarged size of the apparatus.

On the other hand, the provision of the cover for preventing the falling particles from spreading in the inside of the vacuum chamber, and the control of the direction of the flow of process gas, cannot sufficiently prevent the particles (dust) peeled off from the upper electrode, from falling and depositing on the substrate.

Under the above mentioned circumstances, there are demanded a plasma etching method for effectively preventing the particles generated in the plasma etching apparatus, from reaching and depositing on the substrate, by adding a simple mechanism without enlarging the size of the processing apparatus, and a plasma etching apparatus capable of carrying out the method.

SUMMARY OF THE INVENTION

Accordingly, it is an object of the present invention to provide a plasma etching method and a plasma etching apparatus which have overcome the above mentioned defect of the conventional one.

Another object of the present invention is to provide a plasma etching method and a plasma etching apparatus, capable of effectively preventing the particles generated in the plasma etching apparatus, from depositing on the substrate, by adding only a simple modification without enlarging the size of the processing apparatus.

The co-inventors of the present invention measured a relation between the lapse of time and the number of particles generated in the operating course when the substrate is etched in the prior art plasma etching apparatus 10. FIG. 8 is a graph illustrating the result of this measurement. In FIG. 8, the number of particles is indicated by small ovals. The number of particles was measured by introducing a laser light into the processing chamber to pass through a zone confined above the substrate, and by detecting scattering lights from the particles contained in the confined zone, by a CCD camera, so as to count the number of particles. In parallel to the counting of the number of particles, a signal indicative of the operating condition of the etching apparatus was picked up. FIG. 8 shows the accumulated value after 25 wafers have been processed.

In the following, the change of the particle number with the lapse of time in the etching process carried out in the plasma etching apparatus 10 will be described. In order to carry out the etching in the plasma etching apparatus 10, the substrate is fed into the processing chamber through the feeding port, and then, the process gas is supplied When the pressure within the processing chamber reaches a predetermined value, the substrate is electrostatically attracted, and simultaneously, the high frequency voltage is applied so that a plasma is generated to start the etching of the substrate. After the etching is completed, the application of the high frequency voltage, the supplying of the process gas and the electrostatic attraction of the substrate are simultaneously stopped.

With a few seconds from the stopping, in order to quickly exhausting the process gas, an inert gas having no contribution to the etching is supplied as a purge gas for a constant time, so that the pressure in the processing chamber is elevated. The substrate thus etched is fed out from the processing chamber through the feeding port.

It would be understood from FIG. 8 that there is a clear relation between the amount of particles generated in the etching and the operating condition of the apparatus. Namely, almost no particle is generated in the etching processing, but after the completion of the etching, many particles are generated. In particular, the amount of particles generated is at maximum when the purge gas is introduced.

Carefully investigating the image of the scattering light from the particles, the flying course of the particles is apt to go towards the substrate at the time of the completion of the etching, but to go towards the evacuation port when the purge gas is introduced Based on the above mentioned result of measurement, the co-inventors of the present invention reached the following conclusion: If the application of the high frequency voltage and the supplying of the process gas are stopped at the time of the completion of the etching, since the flow rate of the process gas evacuated through the evacuation port by action of a vacuum suction is not so high, the particles, which had floated in the etching process, cannot be exhausted together with the process gas towards the evacuation port, with the result that the particles fall down and move towards the substrate from which the electric charge has not yet completely neutralized. If the purge gas is introduced with a few seconds from the completion of the etching, the particles are exhausted together with the purge gas towards the evacuation port.

Therefore, the co-inventors of the present invention studied to maintain the flow of gas within the processing chamber when the application of the high frequency voltage is stopped, thereby to cause the generated particles to move towards the evacuation port, so that the particles are prevented from depositing on the substrate. As a result, the co-inventors reached the present invention.

In order to achieve the above and other objects of the present invention, there is provided a first method of the plasma etching method in accordance with the present invention which uses a plasma etching apparatus including a processing chamber for etch-processing a substrate, a lower electrode located within the processing chamber for holding the substrate on an upper surface thereof by an electrostatic attraction, and an upper electrode located to face the lower electrode, and which includes the steps of holding the substrate on the lower electrode in such a condition that a surface to be etched of the substrate is faced upwards, then introducing a process gas into the processing chamber, applying a high frequency voltage between the lower electrode and the upper electrode to generate a plasma gas in a low pressure so as to etch the substrate, and thereafter, introducing a purge gas into the process chamber at the time of completion of the processing, wherein at the time of completing the processing, the supplying of the process gas is stopped and it starts to supply the purge gas into the processing chamber, and thereafter, when a predetermined time has elapsed, the application of the high frequency voltage is stopped.

Here, the electrostatic attraction is a holding method for attracting the substrate by action of the electrostatic force. The purge gas is a gas having no contribution to the etching even if the high frequency voltage is applied. For example, the purge gas is composed of an inert gas In this first method of the plasma etching method in accordance with the present invention, the predetermined time is a length of time until the particles floating above the substrate are removed from a zone above the substrate by a flow of the purge gas. Ordinarily, the predetermined time is on the order of a few seconds.

According to a second aspect of the present invention, there is provided a second method of the plasma etching method in accordance with the present invention which uses a plasma etching apparatus including a processing chamber for etch-processing a substrate, a lower electrode located within the processing chamber for holding the substrate on an upper surface thereof by an electrostatic attraction, and an upper electrode located to face the lower electrode, and which includes the steps of holding the substrate on the lower electrode in such a condition that a surface to be etched of the substrate is faced upwards, then introducing a process gas into the processing chamber, applying a high frequency voltage between the lower electrode and the upper electrode to generate a plasma gas in a low pressure so as to etch the substrate, and thereafter, introducing a purge gas into the process chamber at the time of completion of the processing, wherein at the time of completing the processing, the application of the high frequency voltage is stopped, and thereafter, when a predetermined time has elapsed, the supplying of the process gas is stopped and simultaneously it starts to supply the purge gas into the processing chamber.

In this second method of the plasma etching method in accordance with the present invention, the predetermined time is a length of time until he particles floating above the substrate are removed from a zone above the substrate by a flow of the process gas. Ordinarily, the predetermined time is on the order of a few seconds.

According to a third aspect of the present invention, there is provided a third method of the plasma etching method in accordance with the present invention which uses a plasma etching apparatus including a processing chamber for etch-processing a substrate, a lower electrode located within the processing chamber for holding the substrate on an upper surface thereof by an electrostatic attraction, and an upper electrode located to face the lower electrode, and which includes the steps of holding the substrate on the lower electrode in such a condition that a surface to be etched of the substrate is faced upwards, then introducing a process gas into the processing chamber, applying a high frequency voltage between the lower electrode and the upper electrode to generate a plasma gas in a low pressure so as to etch the substrate, and thereafter, introducing a purge gas into the process chamber at the time of completion of the processing, wherein at the time of completing the processing, it starts to supply the purge gas into the processing chamber, and thereafter, when a predetermined time has elapsed, the application of the high frequency voltage and the supplying of the process gas are stopped.

Here, the predetermined time in this third method of the plasma etching method in accordance with the present invention is the same as the predetermined time in the first method of the plasma etching method in accordance with the present invention.

According to a fourth aspect of the present invention, there is provided a fourth method of the plasma etching method in accordance with the present invention which uses a plasma etching apparatus including a processing chamber for etch-processing a substrate, a lower electrode located within the processing chamber for holding the substrate on an upper surface thereof by an electrostatic attraction, and an upper electrode located to face the lower electrode, and which includes the steps of holding the substrate on the lower electrode in such a condition that a surface to be etched of the substrate is faced upwards, then introducing a process gas into the processing chamber, applying a high frequency voltage between the lower electrode and the upper electrode to generate a plasma gas in a low pressure so as to etch the substrate, and thereafter, introducing a purge gas into the process chamber at the time of completion of the processing, wherein at the time of completing the processing, the application of the high frequency voltage is stopped and simultaneously it starts to supply the purge gas into the processing chamber, and thereafter, when a predetermined time has elapsed, the supplying of the process gas is stopped.

Here, the predetermined time in this fourth method of the plasma etching method in accordance with the present invention is the same as the predetermined time in the second method of the plasma etching method in accordance with the present invention.

According to a fifth aspect of the present invention, there is provided a plasma etching apparatus for carrying out the above mentioned first to fourth methods of the plasma etching method in accordance with the present invention, including a processing chamber having an evacuation port, a lower electrode located within the processing chamber for holding the substrate on an upper surface thereof by an electrostatic attraction in such a condition that a surface to be etched of the substrate is faced upwards, and an upper electrode located to face the lower electrode, wherein a purge gas introducing port is provided at a side wall of the processing chamber at a position which is been the upper electrode and the lower electrode in height and which opposes to the evacuation port in a plan view in such a manner that the lower electrode is positioned between the evacuation port and the purge gas introducing port in the plan view.

With this arrangement, the purge gas is flowed substantially in parallel to the substrate. Therefore, when the purge gas is introduced into the processing chamber, the particles floating in a zone above the substrate are effectively transported towards the evacuation port to be exhausted through the evacuation port. As a result, the amount of particles falling on the substrate can be greatly reduced.

In order to carry out the above mentioned first and third methods of the plasma etching method in accordance with the present invention, the plasma etching apparatus preferably includes a sensor for detecting the flow rate of the purge gas, and a controller receiving a detection signal from the sensor, for determining the timing for stopping the application of the high frequency voltage and for actually stopping the application of the high frequency voltage.

In order to carry out the above mentioned second and fourth methods of the plasma etching method in accordance with the present invention, the plasma etching apparatus preferably includes a sensor for detecting the stop of the application of the high frequency voltage, and a controller receiving a detection signal from the sensor, for determining the timing for stopping the supplying of the process gas and for actually stopping the supplying of the process gas.

The above and other objects, features and advantages of the present invention will be apparent from the following description of preferred embodiments of the invention with reference to the accompanying drawings.

DESCRIPTION OF THE PREFERRED EMBODIMENTS

Now, the present invention will be described with reference to the drawings.

Embodiment 1

Figure 1:
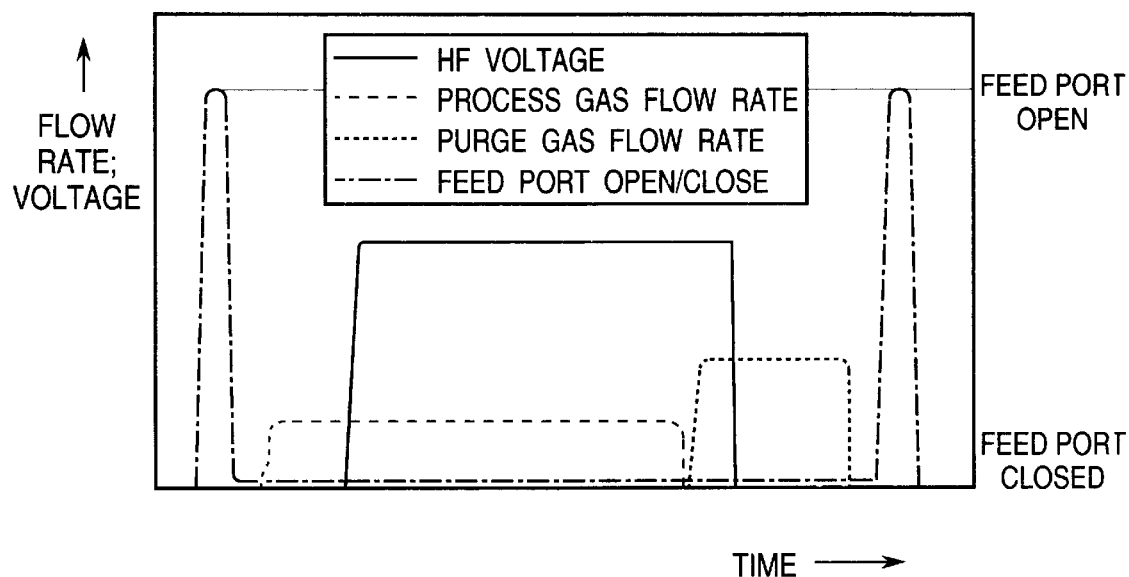
FIG. 1 is a graph showing an operating condition of the plasma etching apparatus, for illustrating a first embodiment of the plasma etching method in accordance with the present invention.
Figure 6:
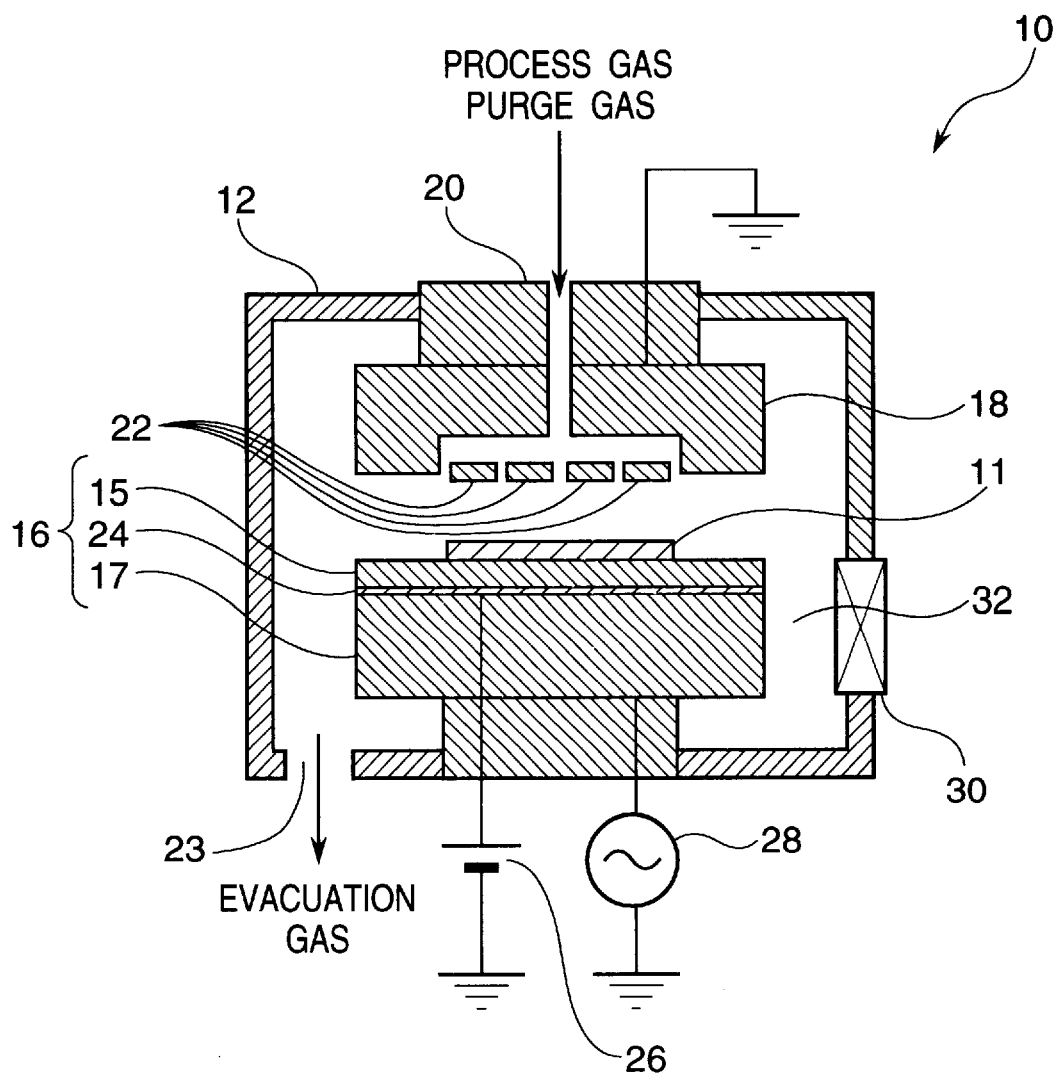
FIG. 6 is a diagrammatic sectional view for illustrating a prior art plasma etching apparatus generally used in a semiconductor device manufacturing factory.
Figure 7:
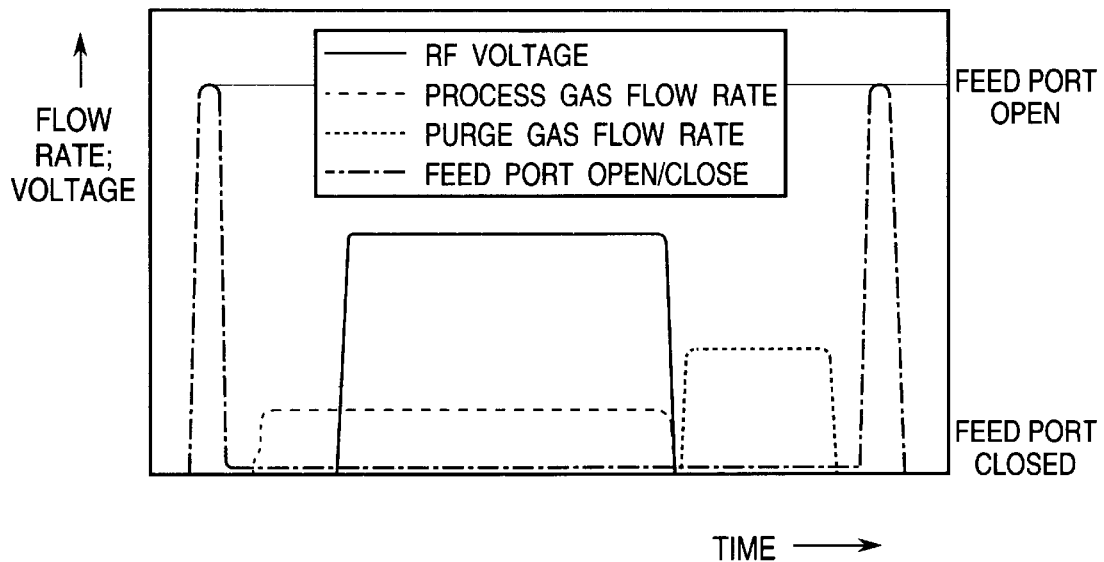
FIG. 7 is a graph for illustrating an operating condition at the time of etching the substrate in the prior art plasma etching apparatus.
Figure 8:
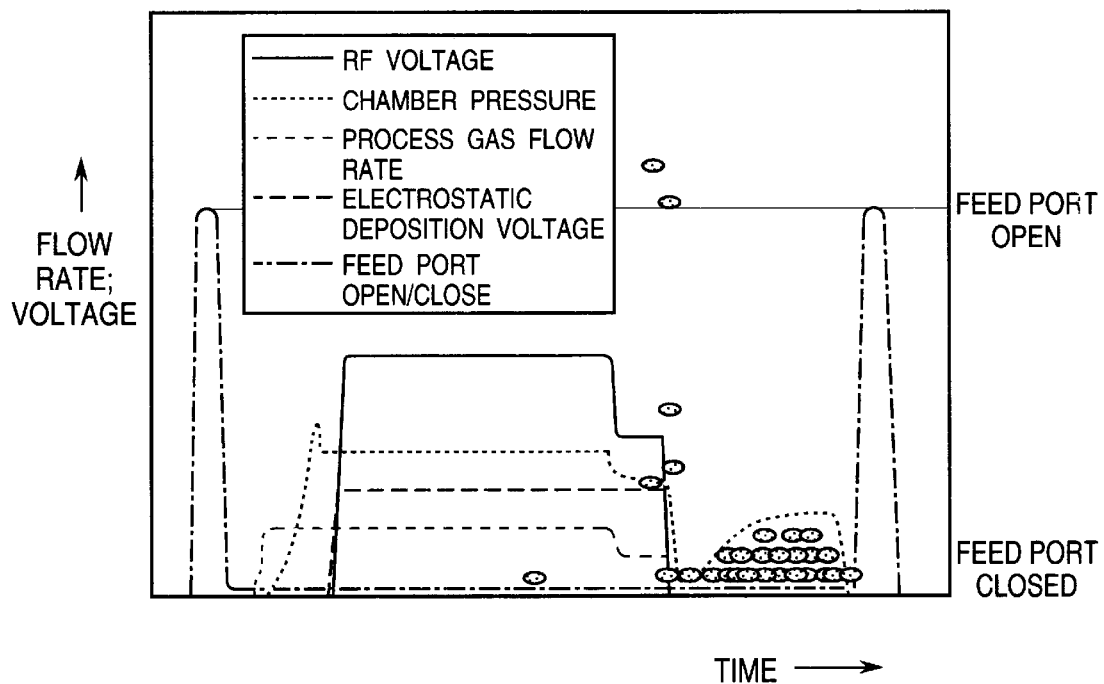
FIG. 8 is a graph for illustrating the relation between the lapse of time and the number of particles generated in the operating course when the substrate is etched in the prior art plasma etching apparatus.

Referring to FIG. 1, there is shown a graph showing an operating condition of the plasma etching apparatus, for illustrating a first embodiment of the plasma etching method in accordance with the present invention, corresponding to one cycle of the substrate processing, when a substrate is etched in the plasma etching apparatus 10 shown in FIG. 6.

In this embodiment, when the etching processing is completed, the supplying of the process gas is stopped, and simultaneously, it starts to supply the purge gas into the processing chamber, similarly to the prior art method. However, when a few seconds have elapsed from the start of the supplying of the purge gas, the application of the high frequency voltage is stopped, differently from the prior art method. Here, the time from the start of the supplying of the purge gas to the stopping of the application of the high frequency voltage corresponds to the time until the particles floating above the substrate are removed from a zone above the substrate by a flow of the purge gas.

With this arrangement, a number of particles which start to fall down from the atmosphere within the chamber, are transported and exhausted by the flow of the purge gas (which is ordinarily of an inert gas), so that the particles are prevented from reaching and depositing on the substrate.

In this case, this embodiment can be carried out by using a plasma etching apparatus having a controller for automatically executing the etching process in accordance with the process shown in FIG. 1. In addition, if a plasma etching apparatus shown in FIG. 5, which will be described hereinafter, is used, this embodiment can be carried out more advantageously.

Embodiment 2

Figure 2:
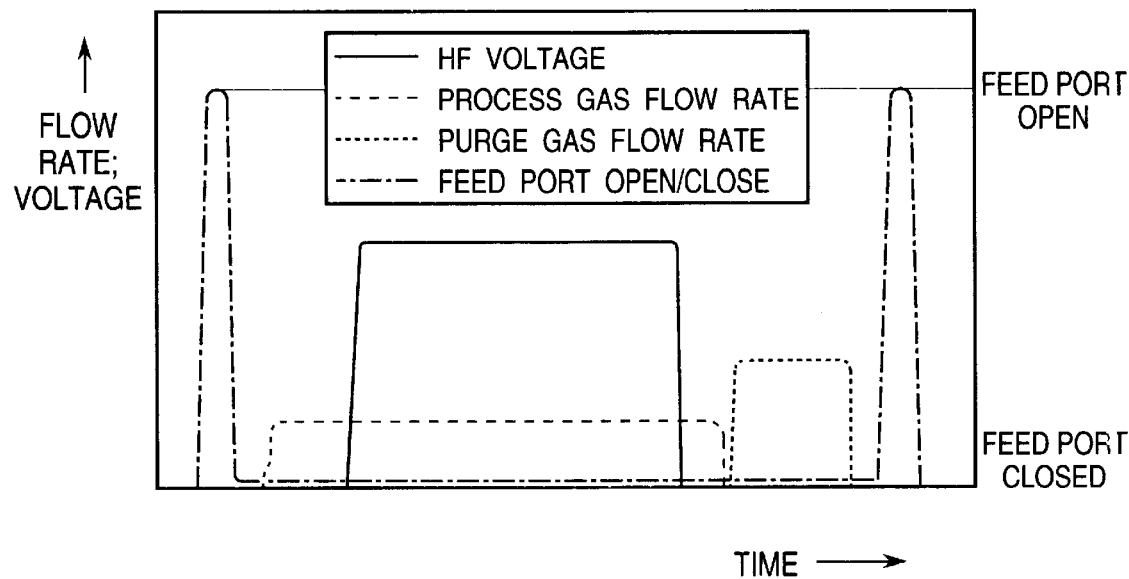
FIG. 2 is a graph showing an operating condition of the plasma etching apparatus, for illustrating a second embodiment of the plasma etching method in accordance with the present invention.

Referring to FIG. 2, there is shown a graph showing an operating condition of the plasma etching apparatus, for illustrating a second embodiment of the plasma etching method in accordance with the present invention, corresponding to one cycle of the substrate processing, when a substrate is etched by using the plasma etching apparatus 10 shown in FIG. 6.

In this embodiment, when the etching processing is completed, the application of the high frequency voltage is stopped, and thereafter, when a few seconds have elapsed from the stop of the application of the high frequency voltage, the supplying of the process gas is stopped and simultaneously it starts to supply the purge gas into the processing chamber. Here, the time from the stop of the application of the high frequency voltage to the stop of the supplying of the process gas, is a time sufficient for neutralizing the remaining electric charge of the substrate after the electrostatic attraction is canceled. For example, this time is on the order of 3 seconds to 5 seconds.

Thus, an advantage similar to that obtained in the first embodiment can be obtained. In this case, if the plasma etching apparatus shown in FIG. 5, which will be described hereinafter, is used, this embodiment can be carried out more advantageously.

Embodiment 3

Figure 3:
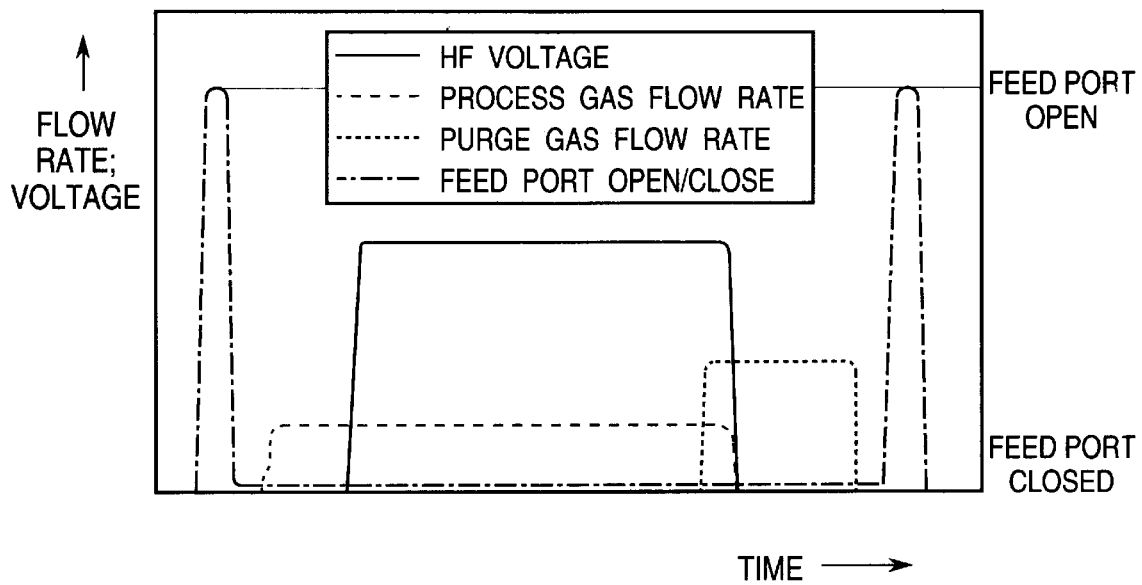
FIG. 3 is a graph showing an operating condition of the plasma etching apparatus, for illustrating a third embodiment of the plasma etching method in accordance with the present invention.
Figure 5:
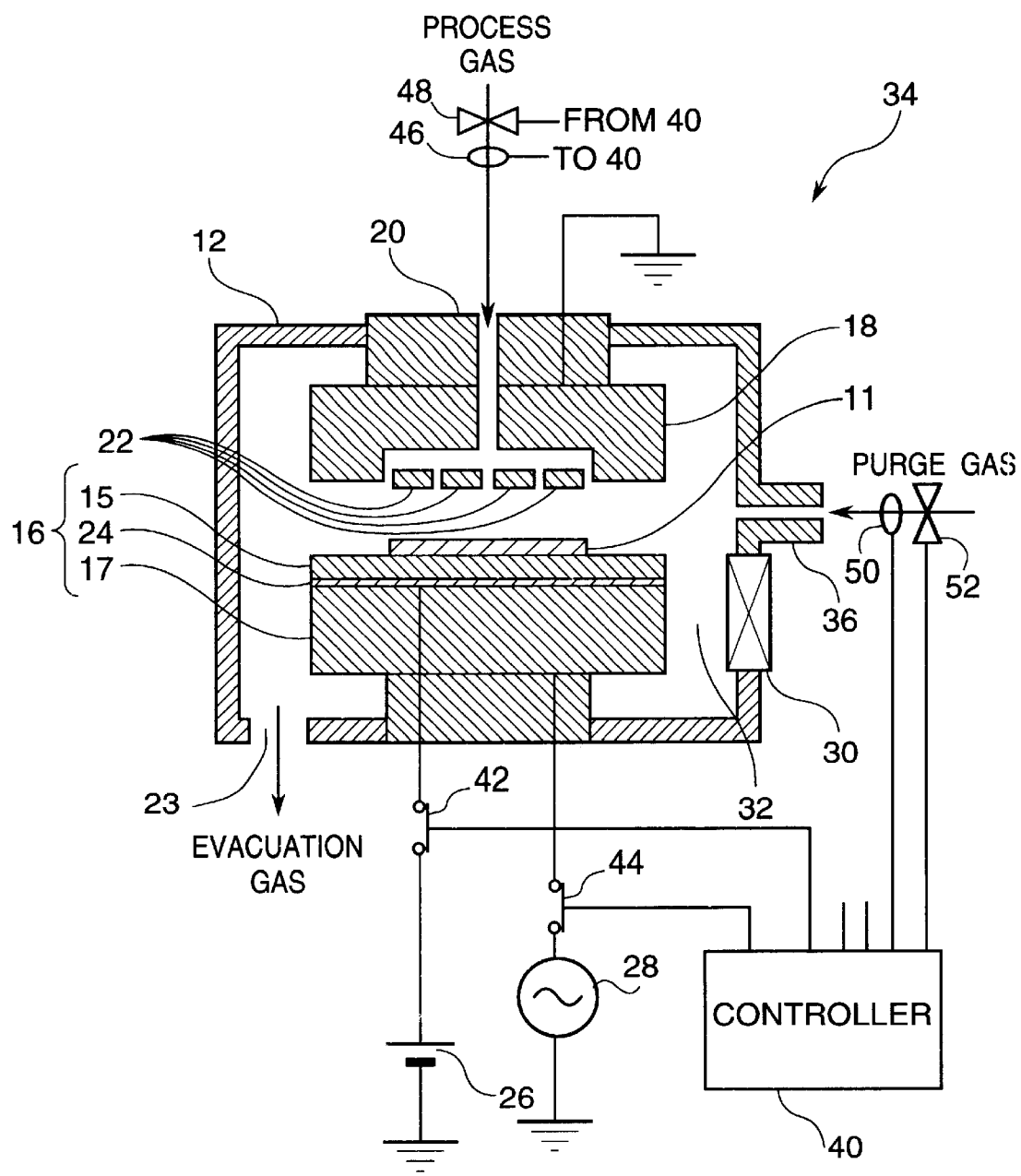
FIG. 5 is a diagrammatic sectional view for illustrating an embodiment of the plasma etching apparatus in accordance with the present invention.

Referring to FIG. 3, there is shown a graph showing an operating condition of the plasma etching apparatus, for illustrating a third embodiment of the plasma etching method in accordance with the present invention, corresponding to one cycle of the substrate processing, when a substrate is etched by using the plasma etching apparatus 10 shown in FIG. 5.

In this embodiment, when the etching processing is completed, the purge gas such as an inert gas having no contribution to the etching is supplied into the chamber, and thereafter, when a few seconds have elapsed from the start of the supplying of the purge gas, the application of the high frequency voltage and the supplying of the process gas are stopped. Here, the time from the start of the supplying of the purge gas to the stopping of the application of the high frequency voltage corresponds to the time until the particles floating above the substrate are removed from a zone above the substrate by a flow of the purge gas. In this case, after the start of the supplying of the purge gas until the stopping of the application of the high frequency voltage, the etching of the substrate continues. Therefore, by considering this time as an over-etching time, the actual etching time is suitably adjusted.

Thus, an advantage similar to that obtained in the first embodiment can be obtained. In this case, if the plasma etching apparatus shown in FIG. 5, which will be described hereinafter, is used, this embodiment can be carried out more advantageously.

Embodiment 4

Figure 4:
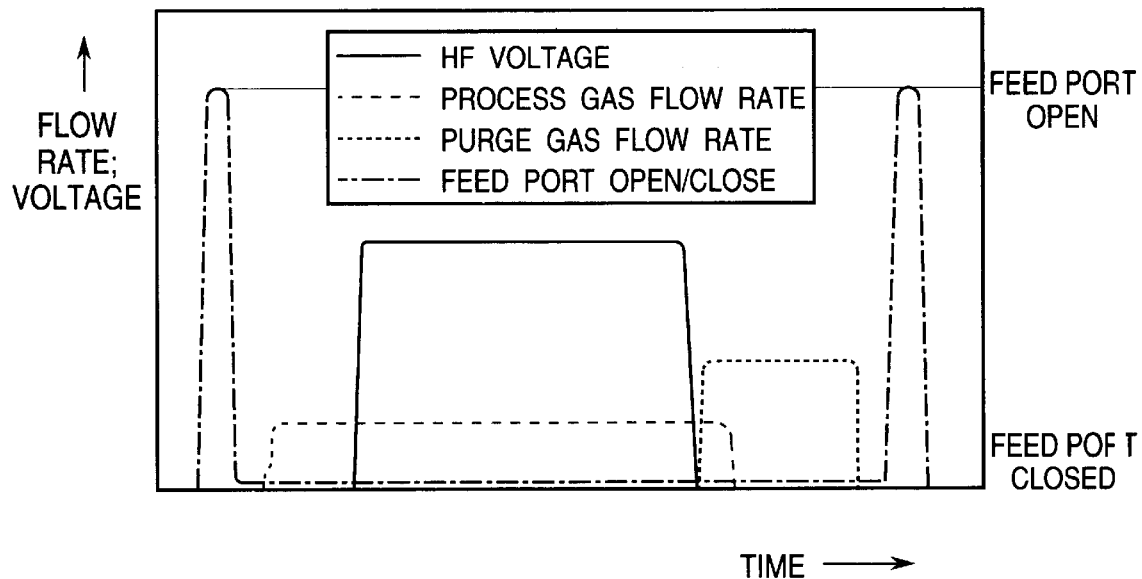
FIG. 4 is a graph showing an operating condition of the plasma etching apparatus, for illustrating a fourth embodiment of the plasma etching method in accordance with the present invention.

Referring to FIG. 4, there is shown a graph showing an operating condition of the plasma etching apparatus, for illustrating a fourth embodiment of the plasma etching method in accordance with the present invention, corresponding to one cycle of the substrate processing, when a substrate is etched by using the plasma etching apparatus 10 shown in FIG. 5.

In this embodiment, when the etching processing is completed, the application of the high frequency voltage is stopped, and simultaneously, it starts to supply the purge gas into the chamber, and thereafter, when a few seconds have elapsed from the start of the supplying of the purge gas, the supplying of the process gas is stopped. Here, the time from the stop of the application of the high frequency voltage to the stop of the supplying of the process gas, is a time sufficient for neutralizing the remaining electric charge of the substrate after the electrostatic attraction is canceled.

Thus, an advantage similar to that obtained in the first embodiment can be obtained. In this case, if the plasma etching apparatus shown in FIG. 5, which will be described hereinafter, is used, this embodiment can be carried out more advantageously.

Embodiment 5

Referring to FIG. 5, there is shown a diagrammatic sectional view for illustrating an embodiment of the plasma etching apparatus in accordance with the. present invention. In FIG. 5, elements similar to those shown in FIG. 5 are given the same Reference Numerals, and explanation will be omitted.

This embodiment of the plasma etching apparatus, generally designated with Reference Numeral 34, includes a purge gas introducing port 36 formed in a side wall of the processing chamber 12, (different from the prior art example shown in FIG. 6. This purge gas introducing port 36 is positioned between the upper electrode 18 and the lower electrode 16 in height, and formed in a wall portion opposing to a wall portion nearest to the evacuation port 23 in a plan view in such a manner that the lower electrode 16 is positioned between the evacuation port 23 and the purge gas introducing port 36 in a diameter direction of the lower electrode 16.

In this plasma etching apparatus 34, the purge gas is flowed from the purge gas introducing port 36 to the evacuation port 23 substantially in parallel to the substrate. Therefore, a disturbance in the gas flow above the substrate is remarkably small in comparison with the prior art example. Therefore, when the purge gas is introduced into the processing chamber, the particles floating in a zone above the substrate are effectively transported towards the evacuation port to be exhausted through the evacuation port. As a result, the amount of particle; falling on the substrate can be greatly reduced.

In the prior art plasma etching apparatus 10 shown in FIG. 6, it was a general practice to supply both the process gas and the purge gas from a position directly above the substrate, and on the other hand, one evacuation port 23 is provided in only one place of the bottom of the processing chamber 12. In this construction, in a zone 32 most remote from the evacuation port 23, a disturbance occurs in the gas flow, so that a disturbance also occurs in the gas flow in a portion near to the zone 32, of the zone above the substrate. Therefore, there was possibility that the particles falls down on the substrate. However, the possibility that the particles falls down on the substrate, has been greatly reduced by the plasma etching apparatus 34.

This plasma etching apparatus 34 can be controlled by a controller 40, which controls a switch 42 for on-off controlling the application of the DC voltage supply 26 to the electrostatically attracting electode 15, and another switch 44 for on-off controlling the application of the high frequency voltage supply 28 to the lower electrode body 17. The controller 40 is connected to receive a detection signal from a flow sensor 46 for detecting the flow rate of the process gas, and to supply a control signal to a valve 48 for on-off controlling the supplying of the process gas. Furthermore, the controller 40 is connected to receive a detection signal from a flow sensor 50 for detecting the flow rate of the purge gas, and to supply a control signal to a valve 53 for on-off controlling the supplying of the purge gas.

Therefore, in order to carry out the above mentioned first and third methods of the plasma etching method in accordance with the present invention, the controller 40 receives a detection signal from the sensor 50 for detecting the flow rate of the purge gas, and if the start of the supplying of the purge gas is detected, when the predetermined time has elapsed from the start of the supplying of the purge gas, the controller 40 determines the timing for stopping the application of the high frequency voltage and turns off the switches 42 and 44 for actually stopping the application of the DC voltage and the high frequency voltage. When the first method is carried out, the controller 40 closes the valve 48 at the same time as the start of the supplying of the purge gas is detected. When the third method is carried out, the controller 40 closes the valve 48 at the same time as the time of turning off the switch 44.

On the other hand, in order to carry out the above mentioned second and fourth methods of the plasma etching method in accordance with the present invention, the controller 40 uses a control signal for on-off controlling the switch 44, as a detection signal of a sensor for detecting the stop of the application of the high frequency voltage. If the stop of the application of the high frequency voltage is detected, when the predetermined time has elapsed from the stop of the application of the high frequency voltage, the controller 40 determines the timing for stopping the supplying of the process gas, and closes the valve 48 for actually stopping the supplying of the process gas. When the second method is carried out, the controller 40 opens the valve 52 at the same time as the time of closing the valve 48. When the fourth method is carried out, the controller 40 closes the valve 48 at the same as the time of turning off the switch 44.

As mentioned above, according to the plasma etching method in accordance with the present invention, when the etching processing is completed, (1) the supplying of the process gas is stopped, and simultaneously, it starts to supply the purge gas into the processing chamber, and thereafter, when a predetermined time has elapsed from the start of the supplying of the purge gas, the application of the high frequency voltage is stopped, or (2) the application of the high frequency voltage is stopped, and thereafter, when a predetermined time has elapsed from the stop of the application of the high frequency voltage, the supplying of the process gas is stopped and simultaneously it starts to supply the purge gas into the processing chamber, or (3) the purge gas such as an inert gas having no contribution to the etching is supplied into the chamber, and thereafter, when a predetermined time has elapsed from the start of the supplying of the purge gas, the application of the high frequency voltage and the supplying of the process gas are stopped, or (4) the application of the high frequency voltage is stopped, and simultaneously, it starts to supply the purge gas into the chamber, and thereafter, when a predetermined time has elapsed from the start of the supplying of the purge gas, the supplying of the process gas is stopped. Accordingly, with a slight modification of the operating condition such as the timing of the stopping of the application of the high frequency voltage, the timing of the supplying of the purge gas, it is possible to effectively minimize the amount of particles falling down on the substrate. Namely, it is possible to effectively minimize the amount of particles depositing on the substrate by a very simple method. On the other hand, according to the plasma etching apparatus in accordance with the present invention, a purge gas introducing port is provided at a side wall of the processing chamber at a position which is between the upper electrode and the lower electrode in height and which opposes to a side wall portion nearest to the evacuation port it a plan view in such a manner that the lower electrode is positioned between the evacuation port and the purge gas introducing port in the plan view.

Therefore, with a minimum modification by newly providing only the purge gas introducing port, it is possible to realize the plasma etching apparatus capable of minimizing the amount of particles falling on the substrate. Namely, the amount of particles falling on the substrate can be greatly reduced without enlarging the size of the plasma etching apparatus and with modification which can be realized with a less number of parts newly added.

The invention has thus been shown and described with reference to the specific embodiments. However, it should be noted that the present invention is in no way limited to the details of the illustrated structures but changes and modifications may be made within the scope of the appended claims.

What is claimed is:

1. A plasma etching method which uses a plasma etching apparatus including a processing chamber for etch-processing a substrate, a lower electrode located within the processing chamber for holding the substrate on an upper surface thereof by an electrostatic attraction, and an upper electrode located to face the lower electrode, comprising:

holding the substrate on the lower electrode such that a surface to be etched of the substrate is faced upwards, introducing a process gas into the processing chamber, applying a high frequency voltage between the lower electrode and the upper electrode to generate a plasma gas in a low pressure so as to etch the substrate, and introducing a purge gas into the process chamber at the time of completion of the processing, wherein at the time of completing the processing, the supply of the process gas is stopped and the apparatus starts to supply the purge gas into the processing chamber, and thereafter, when a selected time value between one half second and sixty seconds has elapsed, the application of the high frequency voltage is stopped.

2. The plasma etching method as claimed in claim 1, wherein the selected time value is chosen to be a length of time until the number of particles floating above the substrate has been reduced to a selected acceptable reduced value and removed from a zone above the substrate by a flow of the purge gas.

3. The plasma etching method as claimed in claim 1, wherein the selected time value is in the range of approximately one to ten seconds.

4. A plasma etching method which uses a plasma etching apparatus including a processing chamber for etch-processing a substrate, a lower electrode located within the processing chamber for holding the substrate on an upper surface thereof by an electrostatic attraction, and an upper electrode located to face the lower electrode, comprising:

holding the substrate on the lower electrode such that a surface to be etched of the substrate is faced upwards, introducing a process gas into the processing chamber, applying a high frequency voltage between the lower electrode and the upper electrode to generate a plasma gas in a low pressure so as to etch the substrate, and introducing a purge gas into the process chamber at the time of completion of the processing, wherein at the time of completing the processing, the application of the high frequency voltage is stopped, and thereafter, when a selected time value between one half second and sixty seconds has elapsed, the supplying of the process gas is stopped and simultaneously the apparatus starts to supply the purge gas into the processing chamber.

5. The plasma etching method as claimed in claim 4, wherein the selected time value is chosen to be a length of time sufficient for neutralizing the remaining electric charge of the substrate after the electrostatic attraction is stopped.

6. The plasma etching method as claimed in claim 4, wherein the selected time value is in the range of approximately one to ten seconds.

7. A plasma etching method which uses a plasma etching apparatus including a processing chamber for etch-processing a substrate, a lower electrode located within the processing chamber for holding the substrate on an upper surface thereof by an electrostatic attraction, and an upper electrode located to face the lower electrode, comprising:

holding the substrate on the lower electrode such a surface to be etched of the substrate is faced upwards, introducing a process gas into the processing chamber, applying a high frequency voltage between the lower electrode and the upper electrode to generate a plasma gas in a low pressure so as to etch the substrate, and introducing a purge gas into the process chamber at the time of completion of the processing, wherein at the time of completing the processing, the apparatus starts to supply the purge gas into the processing chamber, and thereafter, when a selected time value between one half second and sixty seconds has elapsed, the application of the high frequency voltage and the supplying of the process gas is stopped.

8. The plasma etching method as claimed in claim 7, wherein the selected time value is chosen to be a length of time until the number of particles floating above the substrate has been reduced to a selected acceptable reduced value and removed from a zone above the substrate by a flow of the purge gas.

9. The plasma etching method as claimed in claim 7, wherein the selected time value is in the range of approximately one to ten seconds.

10. A plasma etching method which uses a plasma etching apparatus including a processing chamber for etch-processing a substrate, a lower electrode located within the processing chamber for holding the substrate on an upper surface thereof by an electrostatic attraction, and an upper electrode located to face the lower electrode, comprising:

holding the substrate on the lower electrode such that a surface to be etched of the substrate is faced upwards, introducing a process gas into the processing chamber, applying a high frequency voltage between the lower electrode and the upper electrode to generate a plasma gas in a low pressure so as to etch the substrate, and introducing a purge gas into the process chamber at the time of completion of the processing, wherein at the time of completing the processing, the application of the high frequency voltage is stopped and simultaneously the apparatus starts to supply the purge gas into the processing chamber, and thereafter, when a selected time value between one half second and sixty seconds has elapsed, the supplying of the process gas is stopped.

11. The plasma etching method as claimed in claim 10, wherein the selected time value is chosen to be a length of time sufficient for neutralizing the remaining electric charge of the substrate after the electrostatic attraction is stopped.

12. The plasma etching method as claimed in claim 10, wherein the selected time value is in the range of approximately one to ten seconds.

* * * * *